United States Patent
Rangarajan et al.

(10) Patent No.: US 6,878,560 B1
(45) Date of Patent: Apr. 12, 2005

(54) FAB CORRELATION SYSTEM

(75) Inventors: Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/302,091

(22) Filed: Nov. 22, 2002

(51) Int. Cl.[7] .............................................. H01L 21/66
(52) U.S. Cl. ......................................... 438/14; 438/52
(58) Field of Search ..................................... 438/14, 52

(56) References Cited

U.S. PATENT DOCUMENTS 6,303,395 B1 * 10/2001 Nulman ........................ 438/14

* cited by examiner

Primary Examiner—John F. Niebling
Assistant Examiner—Andre' Stevenson
(74) Attorney, Agent, or Firm—Amin & Turocy, LLP

(57) ABSTRACT

A system comprised of a plurality of fabs that are operatively coupled and share data from a common framework for correlating production. The fabs can be coupled via Internet, cellular, optical, landline, microwave and satellite communication means and the like. Data can be transferred to and/or received from a central, integrated correlating entity or from several distributed correlating entities. The fabs send and receive correlating data that relates to production information such as tolerances, critical dimensions, geometry and the like. The correlating entity(s) has the capability to increase production by performing probabilistic computations on the received correlating data and utilizing the resulting information to maintain correlating parameters at remote locations. The computations performed can include such calculations as Bayesian inferencing and the like. The system inherently precludes the necessity for physically transporting parametric test entities between different fab or tooling locations.

19 Claims, 7 Drawing Sheets

FAB CORRELATION SYSTEM

FIELD OF INVENTION

The present invention relates generally to multiple fab correlating systems and, in particular, to multiple fab correlating systems utilizing a common data structure for correlating references.

BACKGROUND OF THE INVENTION

The demand for solid-state electronics has increased exponentially since the 1950's, mainly due to the public's desire for smaller and faster products. To meet this need, solid-state manufacturers have continuously down-sized their products beyond what is visible to the naked eye. The sizes have become so small that they are often limited by the molecular properties of the material from which they are created. Furthermore, the manufacturing tolerances for the devices are even smaller. When manufacturing a product at this microscopic level, a slight variation in the allowable tolerances can reduce product quality or even make it nonfunctional. This poses a major problem for the production of semiconductors.

Manufacturers spend large amounts of money on controlling their processes to ensure that a high quality product is produced. Each step of the process is closely monitored to verify that the process is within certain manufacturing tolerances. These tolerances are defined so that the margin of variance does not put the final product in jeopardy. To better comprehend the complexities of the issues surrounding manufacturing tolerances, it is important to understand how the products are constructed.

Semiconductor devices begin life in a molten mixture from which a pure seed crystal is placed into and drawn from, creating a structured crystal ingot. The ingot is then sliced into thin pieces called "wafers". The wafers are used as the base structure for creating layers of material with varying properties. This variance in properties is what creates different types of semiconductor characteristics. The small sizes require the use of highly precise machines for tooling the wafers. In order for the machinery to maintain this precision, test wafers are created from the group of sliced wafers. These test wafers are generally marked with critical dimensions that can be measured by the machines.

One type of these machines is the Critical Dimension Scanning Electron Microscope (CD SEM). It is used to measure extremely small dimensions marked on the test wafers. These dimensions can then be used to calibrate the tooling machines necessary for production. Generally, the CD SEM is used to gauge production quality after individual fabrication processing has occurred. It is not uncommon to have multiple CD SEMs in a fabrication environment. This drives a strong need to have the CD SEMs consistently match within a predetermined specification. It may be necessary to check the CD SEM parameters on a daily basis to ensure it is within the desired tolerance.

When a new machine is brought into the manufacturing process, great care is taken to qualify its parameters. Any machine, no matter how precise, will always have a certain amount of deviation in accuracy. To offset this fact, the new machine is analyzed to make sure it meets the equipment specifications necessary to perform a particular aspect of a semiconductor development phase. Once the machine is incorporated into the manufacturing process, it must be continually monitored to protect against equipment drift and alterations in materials or in the environment. All manufacturing processes are inherently unstable and must be rigidly monitored to avoid ruining the end product.

Often, the manufacturing process will require different types of fabrication or "fab" to complete a single device. For various economic reasons, these fab facilities may not be physically located near each other. The fabs might even reside in different countries. Devices, such as a test wafer, used for calibrating the tooling machinery will need to be shipped between locations. Problems associated with device transporting are further compounded due to the fact that some fabs require repeated exchanges of test wafers to maintain tolerances between the facilities. Production for a particular machine may have to cease while the test wafer is being transported. This causes lower output and increased average cost for the manufactured device. Additionally, transit time for the test wafer prevents any "real time" synchronizing between facilities. Another detrimental side effect is that anytime a device has to be moved from place to place, the odds of it becoming lost or accidentally damaged increase dramatically. If this occurs, it creates an enormous cost both in time and money due to downtime and the reconfiguration of new test wafers.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally to semiconductor fabrication and, in particular, to a fabrication correlating system. By mitigating the need to transport test entities between semiconductor fabrication facilities, semiconductor production tool calibration is accomplished without unnecessary calibration delays, increasing production yield and reducing production costs.

The present invention facilitates the semiconductor processes by aiding the efficiency in the way the processes are accomplished. Information is obtained from a fabrication facility and analyzed. The resulting analysis can be employed to remotely calibrate semiconductor fabrication devices. It can also facilitate production efficiency by predicting when a fabrication device needs to be calibrated. The analysis can also aid the quality of the produced semiconductor devices by ensuring synchronization, not only of the fabrication devices of a single fabrication facility, but also of multiple fabrication facilities.

An aspect of the present invention provide for a fab correlating system that allows fab data to be correlated to itself or other fabs. This can be accomplished without the need for physically transporting a test wafer between fab locations. The required data is passed via a communication means from each fab to a centralized or distributed correlating system for analysis. The communication means includes Internet, cellular, landline, radio, microwave, optical, and satellite communications and the like. The data is analyzed to determine if the various fabs are within tolerances allowed for a given process. Data can be sent back to the fabs to allow for adjustments accordingly. The data can also be analyzed in a Bayesian inference model to determine when a fab might go out of tolerance. This enables the fab to continue to operate without the necessity of halting production to test the calibration of the equipment unnecessarily.

Another aspect of the subject invention provides for employing a set of test wafers wherein subsets of the wafers are employed at various semiconductor fabrication facilities (FABS). Correlation of equipment and processes at the respective FABs are performed relative to the respective test wafer batches. The test wafers are constantly monitored against various operating conditions (e.g., temperature, pressure, vibrations, humidity, time of day, pollutants, equipment state, process state, . . . ) and other fabrication-related extrinsic data so at to correlate changes to the test wafer with extrinsic variables that have an affect on a fabrication process. Various non-linear training methods (e.g., neural networks, Bayesian networks, expert systems . . . ) may be employed in connection with the subject invention. Moreover data fusion analysis can be employed to determine correlations between various variables that influence the fabrication process.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
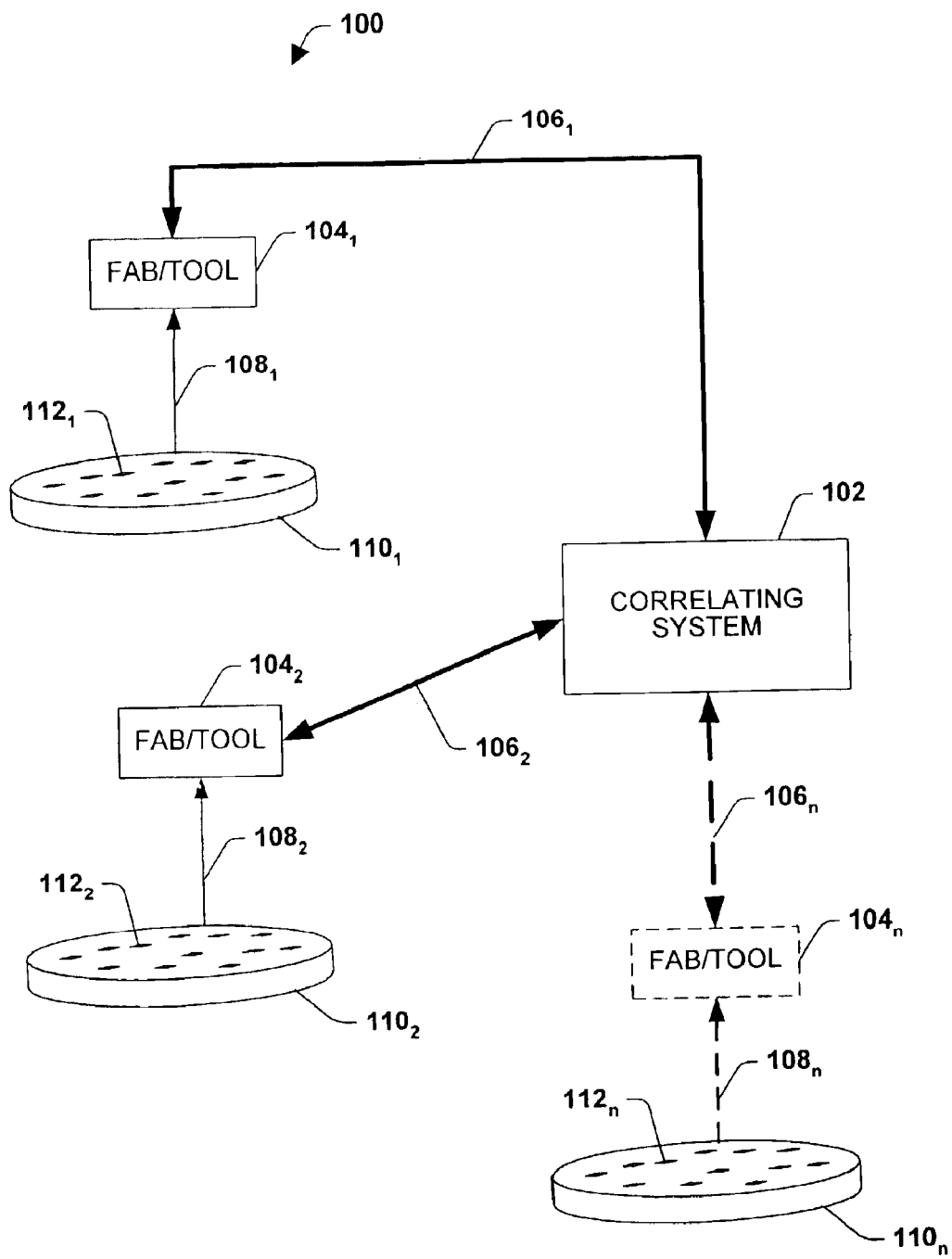
FIG. 1 is a diagram of a fab correlating system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

The present invention provides a fab correlating system that allows fab data to be correlated to itself or other fabs. This is accomplished without the need for physically transporting a test wafer between fab locations. The required data is passed via a communication means from each fab to a centralized or distributed correlating system for analysis. The communication means includes Internet, cellular, landline, radio, microwave, optical, and satellite communications and the like. The data is analyzed to determine if the various fabs are within tolerances allowed for a given process. Data can be sent back to the fabs to allow for adjustments accordingly. The data can also be analyzed in a Bayesian inference model to determine when a fab might go out of tolerance. This enables the fab to continue to operate without the necessity of halting production to test the calibration of the equipment unnecessarily.

Referring to FIG. 1, a diagram of a fab correlating system 100 in accordance with an aspect of the present invention is depicted. The fab correlating system 100 includes a correlating system 102 and a first fab/tool $104_1$ through an $n^{th}$ fab/tool $104_n$, n being an integer greater than or equal to two. The first fab/tool $104_1$ through the $n^{th}$ fab/tool $104_n$ can be referred to collectively as the fab(s) 104. The fab correlating system 100 further includes first communication means $106_1$ through an $n^{th}$ communication means $106_n$, collectively referred to as the communication means 106.

The fab(s) 104 can read data $108_1$, $108_2$, $108_n$ from the test wafers $110_1$, $110_2$, $110_n$, respectively. As an example, critical dimension marks $112_1$, $112_2$, $112_n$ are shown on the test wafers $110_1$, $110_2$, $110_n$, respectively. These critical dimension marks $112_1$, $112_2$, $112_n$ are measured by the fab(s) $104_1$, $104_2$, $104_n$ and can constitute the data $108_1$, $108_2$, $108_n$ sent from the fab(s) 104 to the correlating system 102.

The fab(s) 104 include at least one manufacturing tool. Normally, a fab has several tools employed for completing that particular fab process. Each of the tools requires calibration to operate properly. The calibration is accomplished using test wafers $110_1$ $110_2$, $110_n$. These test wafers $110_1$ $110_2$, $110_n$ are selected from a set of wafers that will be used in the manufacturing process to produce semiconductor devices. Each test wafer $110_1$ $110_2$, $110_n$ has parametric data that is read by the particular tool. When a CD SEM is employed, it can measure a processed wafer after a particular tool has completed its operations and provide data also. The fab gathers the information and sends it to the correlating system 102 via the communication means 106.

The communication means 106 comprises such things as Internet, cellular, landline, radio, microwave, optical, and satellite communications and the like. Other wireless technologies can be utilized as well. When the correlating system 102 is co-located with a fab, the communication means 106 can also be Ethernet, wire, and wireless and the like. Although not as efficient as the prior means mentioned, the communication means 106 can also be data media transference. This involves storing the fab data on a type of media such as a floppy disk, removable hard drive, flash disk and optical disk and the like. The media is then transported to the location of the correlating system. This allows the data to be transferred and, although not efficient, is less likely to be damaged as would a fragile test wafer. The lists given are not meant to be conclusive lists. As science progresses, other communication means not yet developed can be utilized.

The correlating system 102 comprises a means, distributed or centralized, to analyze the data 108 from the fab(s) 104. The means can be a simple comparator or a more complex computing device. When the correlating system 102 is distributed, it comprises one or more correlating entities that combine to yield the correlating system 102. Thus, the correlating system 102 can include one or more of the fab(s) 104 themselves. When the correlating system 102 is centralized, it comprises a computing type entity that can distribute and receive information to and/or from the fab(s) 104. FIG. 1 shows the correlating system 102 as a centralized system. Each of the plurality of fabs 104 is sending data to one entity, the correlating system 102.

When the Internet is employed as the communication means 106, the correlating system 102 becomes substantially the entire global Internet network. This allows an operator to access the correlating system 102 virtually anywhere in the world without transporting computing devices. It also presents an existing structure for a distributed type of correlating system 102. In effect, the correlating system 102 employs the computing resources provided by the Internet to perform its required functions. These computing resources can reside anywhere in the world. Distribution of computing resources helps reduce the risk of a single point failure interrupting the flow of data or worse yet, the manufacturing process.

Utilizing the Internet, however, does not preclude a centralized type of correlating system 102. When required, the correlating system 102 can still be a single computing entity located at a specific place, accessed via the Internet. The benefits of having a centralized system include easier hardware and software maintenance and upgrade(s). The computing capacity, speed and integrity can be controlled to a higher degree. These attributes can play an important part in correlating manufacturing data. If the fab processing network is extremely large, the amount of data flow and the latency of the data, may preclude the Internet as the communication means 106. The Internet is inherently a non-deterministic data transport system. The standards that govern the Internet do not require that data be transferred at a specific time with a specific latency. When timing and latency are critical to the correlating system 102, other communication means can be employed to ensure data timing. For example, low latency types of communications that can be utilized include direct connections via satellite, cellular, landline, radio, optical and microwave and the like.

The analysis performed by the correlating system 102 can be based upon belief networks, fuzzy logic and neural networks and the like. Intelligent agents can also be utilized to represent proxies of the individual fab(s) 104. In this instance, the agents model the physical hardware and software of the fab(s) 104. This allows for simulating the responses from the individual fab(s) 104 without requiring data to be transferred to and from the actual physical fab(s) 104. A belief network or "Bayesian Network" can also be used to predict the probabilities that the particular fab is within tolerance. The analysis can also be a simple correlation of present or historical data for a fab or group of fabs.

Additionally, the present invention allows for the real time collection of data. As parametric data is being measured on one fab, it can be sent simultaneously to other fabs within the system. This can be accomplished by utilizing a direct connection as the communication means 106. The fab(s) 104 can also be interoperatively coupled so that the adjustments required for calibration are not only made to the present fab, but also for the other fabs. In this manner, the wafer test data from a single fab can be used almost instantaneously to set the parameters for any other fab in the system. This can reduce errors induced by human interaction in calibration steps.

Data collected from the various fabs can be stored in a common database and various types of tables. The data needs to be structured such that a converging algorithm can be utilized to derive the degree of calibration error. Additionally, relational type databases can be used to maintain the fab relationships and track compounding errors. Although every single fab in a manufacturing process can be within tolerance, a group of fabs, as a whole, can indicate a trend towards becoming out of calibration for the entire process. The present invention gives the capability for monitoring this manufacturing process tolerance. It removes the risk associated with ensuring that each individual tolerance specification will combine to yield an entire process that is within tolerance.

Although the present invention can preclude the necessity of transporting test wafers to various fabs, it can also facilitate the continued use of such test wafers. By utilizing the data collected from one fab, a predictive calibration value set can be derived for a second fab. These values can be programmed into the second fab in anticipation of receiving the test wafers. If the predictions are correct, adjustments to the second fab can be minimal. When the test wafers are finally transferred between the fabs, the complexity and time to calibrate the second fab are reduced. This helps mitigate costs by allowing for short downtimes.

Optimally, it is desirable to negate transporting test wafers between fabs. This decreases costs caused by idle time while waiting for the wafers. Data is shared such that a "virtual reference point" is created. This reference point can then be distributed between the fabs in a manufacturing process. Eliminating the need for physical test wafers also eliminates the risks of losing test wafers in transit and of lengthy delays due to delayed shipments. When fabs are located in one facility or in one city, this may not be a substantial amount of risk. However, as the semiconductor business expands, it is likely that the fabs will be located in different countries. When this occurs, transporting physical test wafers will become a major issue to contend with.

Additionally, the correlating system 102 shown in FIG. 1 can also be used to automatically calibrate and synchronize the fab(s) 104. Interactive signals can be sent between the fab(s) 104 and the correlating system 102 to create a common signature pattern. The signature pattern can then be used to track substantially all of the fab(s) 104 in the manufacturing process. It can be beneficial to store these common signature patterns so that comparisons can be made in the future. Such comparisons can include yield versus signature pattern, downtime versus signature pattern, operating costs versus signature pattern and the like. In this manner, the common signature patterns can be used to tune the entire manufacturing process to increase its profitability. At certain times, profitability may be dictated by a higher yield, while other times it may be dictated by lower operating costs. A desired common signature pattern can be selected that would serve to produce the desired effect. These patterns can be stored along with the individual fab test wafer data.

Yet another aspect of the present invention allows for utilizing the data to tune and control the semiconductor processes. Tuning requires removing equipment from the manufacturing process and analyzing the data received from the fabs to increase performance of the equipment. As an example, steppers are normally statically tuned. They are run open loop and are controlled by discrete tuning events per a predetermined schedule. Presently, the number of stepper tuning events is increasing rapidly in the industry as the machines are utilized for longer periods to increase yield. Production suffers as the number of stepper tuning events increases. This is due to the requirement that the steppers must be removed from the process line in order to be tuned. Thus, the industry has turned to predictive tuning to help mitigate this issue. Predictive tuning utilizes statistical process control information to best schedule stepper tuning based on actual machine performance. This allows stable steppers to continue to operate without unnecessary tuning and flags unstable steppers that require tuning. The present invention provides for the capability to receive this data and correlate it to previous data to determine the scheduling necessary for predictive tuning. In addition, the present invention can also provide for control of the semiconductor process. Control entails using the fab data to feedback corrections to the manufacturing process. Due to the communication means between the fabs, this can be done in real time using the present invention.

In the same light, send ahead wafers or "pilot" wafers can be eliminated with the present invention. Generally, pilot wafers are used to pre-check tolerances during production flow. The present invention has the capability to receive the data from the fabs where the wafer is currently located and send it to the fab that would normally utilize the pilot wafer. Thus, there is no need to physically send the pilot wafer to the next fab.

In still yet another aspect of the present invention, global matching of machines can be accomplished. Global matching can be achieved by utilizing the fab data from the various manufacturing machines. The fab data is correlated to discover which machines are closely matched. This information is then used to allow the manufacturing process to utilize several different machines for the same step in a process. This differs from previous manufacturing practices where only a particular machine, such as stepper "A", could only be used for critical overlays. By correlating the fab data to find other machines close in tolerance to stepper "A", those machines could also be used to do the critical overlays. This would decrease the backlog of stepper "A" and increase production yield. The present invention is also capable of storing lens distortion signatures of every stepper lens in a fab and correlating the data to determine which steppers can be used interchangeably.

As noted above, it is to be appreciated the subject invention provides for employing a set of test wafers wherein subsets of the wafers are employed at various semiconductor fabrication facilities (FABS). Correlation of equipment and processes at the respective FABs are performed relative to the respective test wafer batches. The test wafers are constantly monitored against various operating conditions (e.g., temperature, pressure, vibrations, humidity, time of day, pollutants, equipment state, process state, . . . ) and other fabrication-related extrinsic data so at to correlate changes to the test wafer with extrinsic variables that have an affect on a fabrication process. Various non-linear training methods (e.g., neural networks, Bayesian networks, expert systems . . . ) may be employed in connection with the subject invention.

Moreover data fusion analysis can be employed to determine correlations between various variables that influence the fabrication process in order to take advantage of information fission which may be inherent to a process relating to sensing a physical environment through several different sensor modalities. In particular, one or more available sensing elements may provide a unique window into the physical environment where the phenomena to be observed is occurring. Because the complete details of the phenomena being studied (e.g., detecting the operating state of the system or components thereof) may not be contained within a single sensing element window, there is information fragmentation which results from this fission process. These information fragments associated with the various sensing devices may include both independent and dependent components.

The independent components may be used to further fill out (or span) the information space and the dependent components may be employed in combination to improve the quality of common information recognizing that all sensor data may be subject to error and/or noise. In this context, data fusion techniques employed in a data fusion system may include algorithmic processing of sensor data in order to compensate for the inherent fragmentation of information because a particular phenomena may not be observed directly using a single sensing element. Thus, the data fusion system provides a suitable framework to facilitate condensing, combining, evaluating and interpreting the available sensed information in the context of the particular application. It will further be appreciated that the data fusion system may be employed in a diagnostics and control system in order to employ available sensors to infer or derive attribute information not directly measurable, or in the event of sensor failure, and additionally, to detect sensor failure, and to continue to diagnose and control system operation with failed sensor components.

It is to be appreciated that optionally the subsets of wafers can be circulated among FABS so as to facilitate cross-correlation in accordance with the present invention. Moreover, as correlation data is populated in a storage medium in accordance with the subject invention, the data can be employed in connection with trend analysis, closed-loop control, open-loop control so as to improve quality and yield associated with a semiconductor fabrication process.

Figure 2:
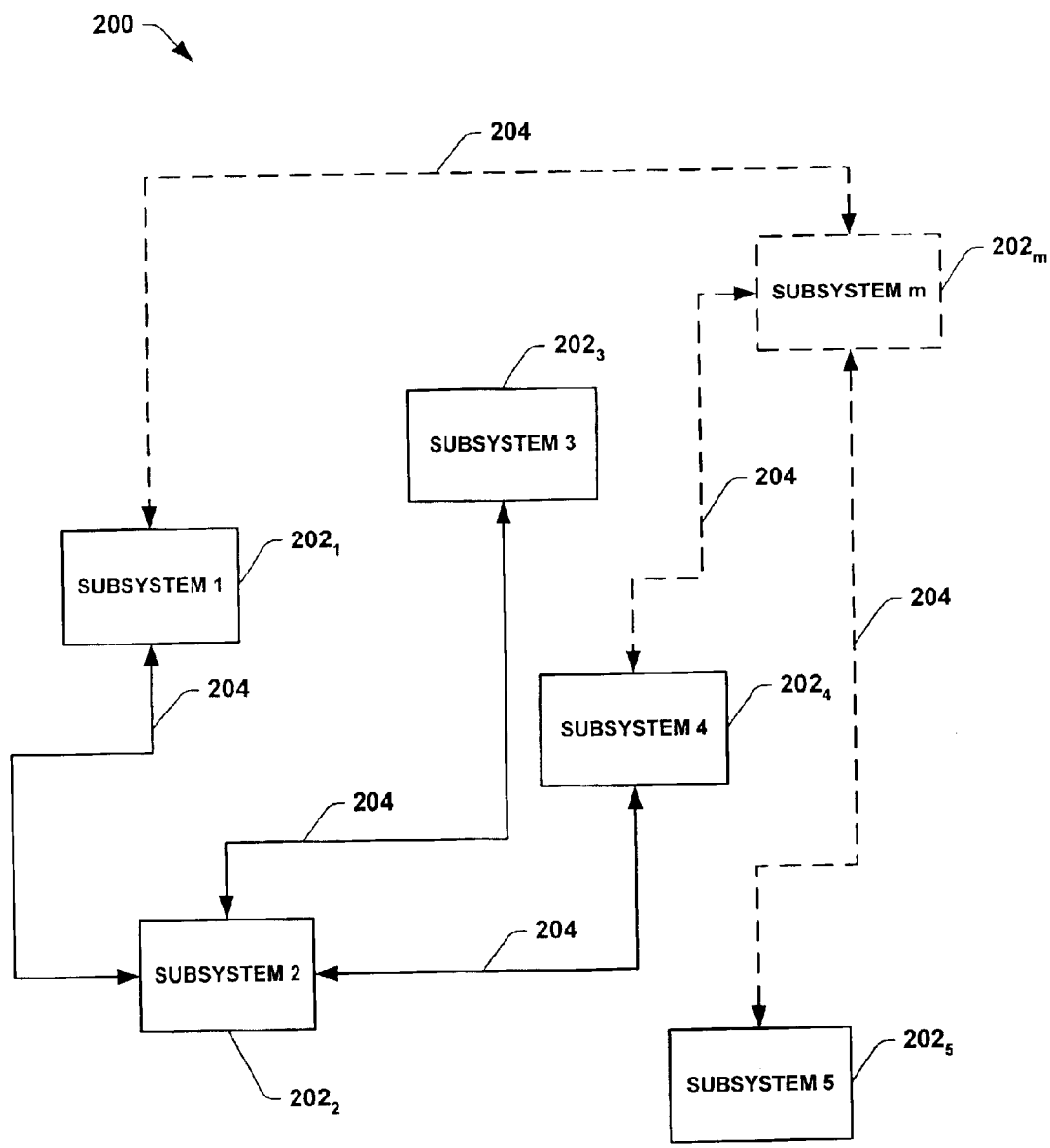
FIG. 2 is a block diagram of a distributed correlating system in accordance with an aspect of the present invention.

Turning to FIG. 2, a block diagram of a distributed correlating system 200 in accordance with an aspect of the present invention is shown. The distributed correlating system 200 can include a first subsystem $202_1$ through an $m^{th}$ subsystem $202_m$, m being an integer greater than or equal to one. The first subsystem $202_1$ through the $m^{th}$ subsystem $202_m$ can be referred to collectively as the subsystems 202.

The subsystems 202 are linked together by a communication means 204. The communication means 204 can be of one type or a mixture of different types of communication such as Ethernet, satellite, landline, cellular, radio, optical, and microwave and the like. It should be noted that it is not required for all subsystems to have a direct communication path to all other subsystems. Computing resources can communicate to remote computing resources by having information relayed through other computing resources. Having multiple communication paths between the computing resources increases the integrity of the system. For example, for Subsystem "5" $202_5$ to reach Subsystem "1" $202_1$, it can communicate through Subsystem "m" $202_m$ to Subsystem "1" $202_1$. It can also reach Subsystem "1" $202_1$ through Subsystem "m" $202_m$, Subsystem "4" $202_4$ and Subsystem "2" $202_2$. This allows fabs in a single country to communicate without having to send data out of the country to reach a fab in a neighboring state.

The correlating system 200 in FIG. 2 can comprise subsystems 202 that are representative of individual fabs. In other words, the fabs themselves provide computing resources that are used as part of the correlating system 200. However, each subsystem 202 can also be an entity totally unrelated to the fabs. For instance, the subsystems 202 can be a hierarchy of computing devices that span the globe. Such an example of a distributed correlating system 200 would be the computing resources behind the Internet. Utilizing the distributed nature of the Internet allows for an almost uninterrupted flow of information. If a computing device goes down, all data is re-routed to other devices within the Internet system. In another aspect of the present invention, some of the fabs are included, while others are not. This allows the correlating system 200 to be expandable. It is not necessary to make the system 200 bounded or constrained by types of computing resources.

Figure 3:
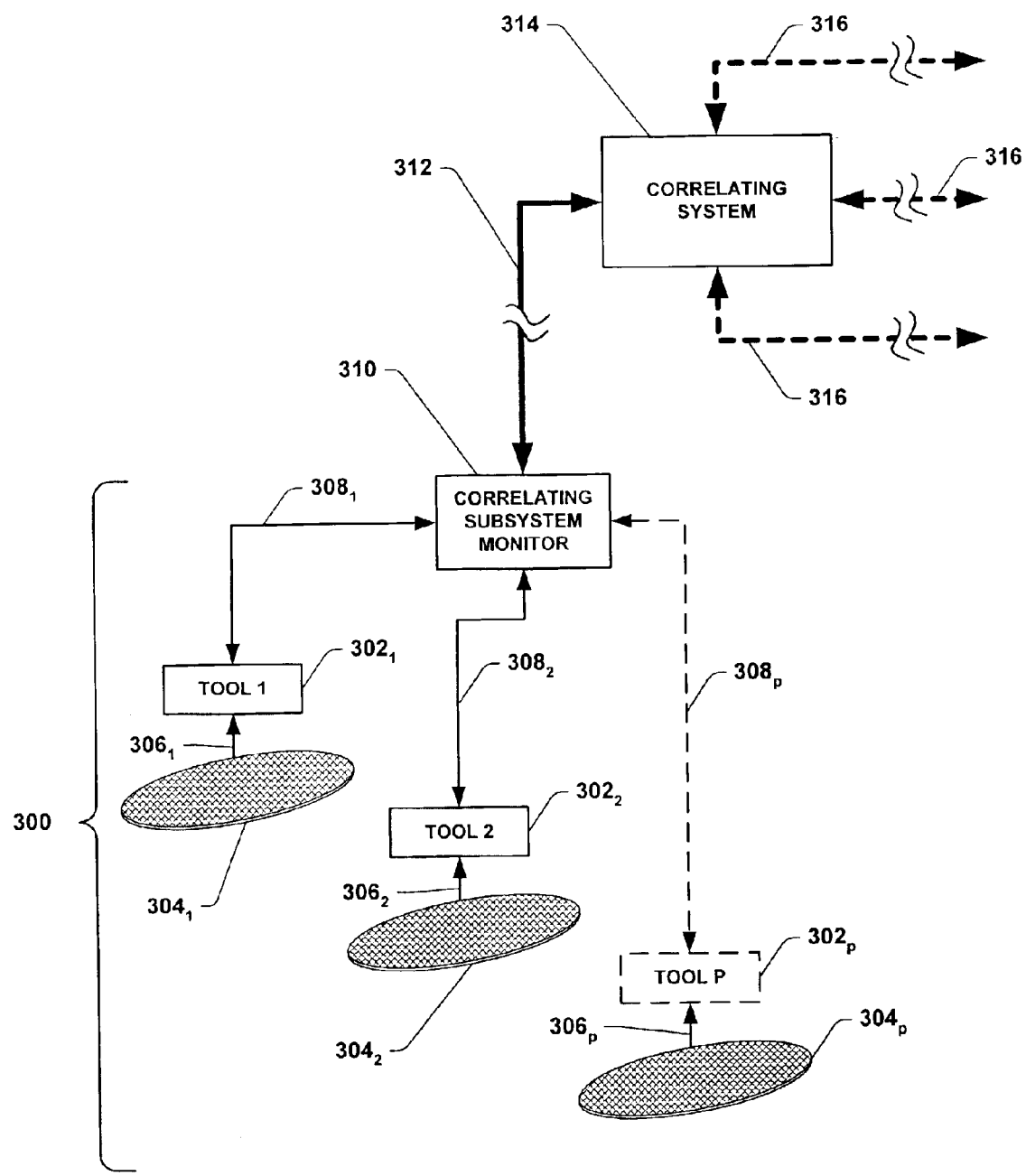
FIG. 3 is a diagram illustrating data input from a typical fab in accordance with an aspect of the present invention.

If FIG. 3, a diagram illustrating data input from a fab 300 in accordance with an aspect of the present invention is shown. The fab 300 includes a first tool $302_1$ through a $P^{th}$ tool $302_P$, P being an integer greater than or equal to one. The first tool $302_1$ through the $P^{th}$ tool $302_P$ can be referred to collectively as the tool(s) 302. One or more of the tool(s) 302 can include a test wafer $304_1$, $304_2$, $304_P$. The fab 300 can further include a correlating subsystem monitor 310.

The fab 300 can consist of a single manufacturing tool(s) 302. However, it is more likely that the fab 300 will have several tool(s) 302 in its process. The correlating subsystem monitor 310 is an entity that can send tool data to a correlating system 314. It can also have additional functions to allow it to store local data and retrieve the data upon demand by the correlating system 314. The subsystem monitor 310 can also receive control, synchronization, and/or notification data and the like from the correlating system 314.

In one example, the tool(s) 302 can provide this function directly, negating any need for an intermediary device. In that scenario, the tool(s) 302 would need a direct communication means 312 to the correlating system 314.

In another example, the fab 300 can have a correlating subsystem monitor 310 to facilitate localized tool correlation and to store and send data when the tool(s) 302 are incapable of doing so. A typical scenario involves the tool(s) 302 in the fab 300 reading a set of test wafers $304_1$, $304_2$, $304_P$ to determine critical dimensioning and other parametric data 306. This data 306 is sent to the correlating subsystem monitor 310 via a communication means $308_1$, $308_2$, $308_P$, sometimes collectively referred to as the communication means 308. Other data relating to the inherent inaccuracies of the tool(s) 302 can also be sent to the correlating subsystem monitor 310. The communication means 308 can be Ethernet, optics, wire, wireless, radio and the like.

The data is then further sent to the correlating system 314 for processing via the communication means 312. This communication means can be satellite, cellular, Internet, radio, landline, microwave, optical, and the like. The correlating system 314 is shown accepting data from other fabs 316 as well.

Figure 4:
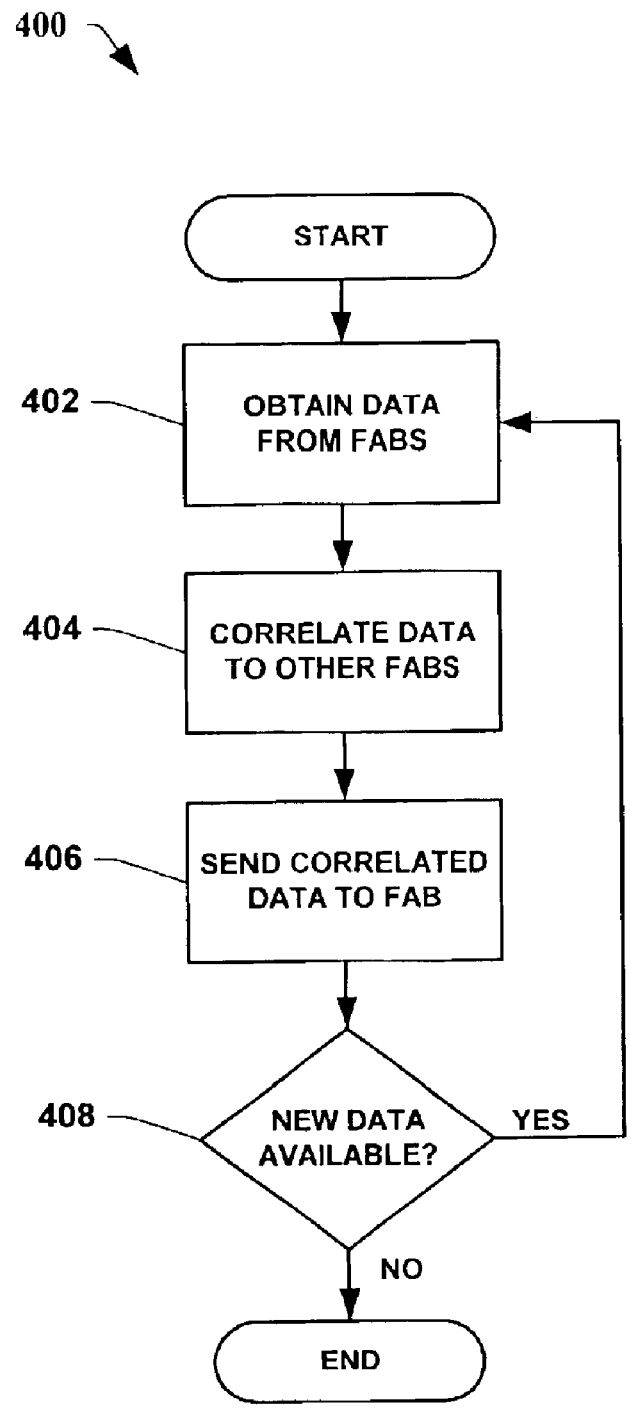
FIG. 4 is a flow chart illustrating a method for data correlating in accordance with an aspect of the present invention.
Figure 5:
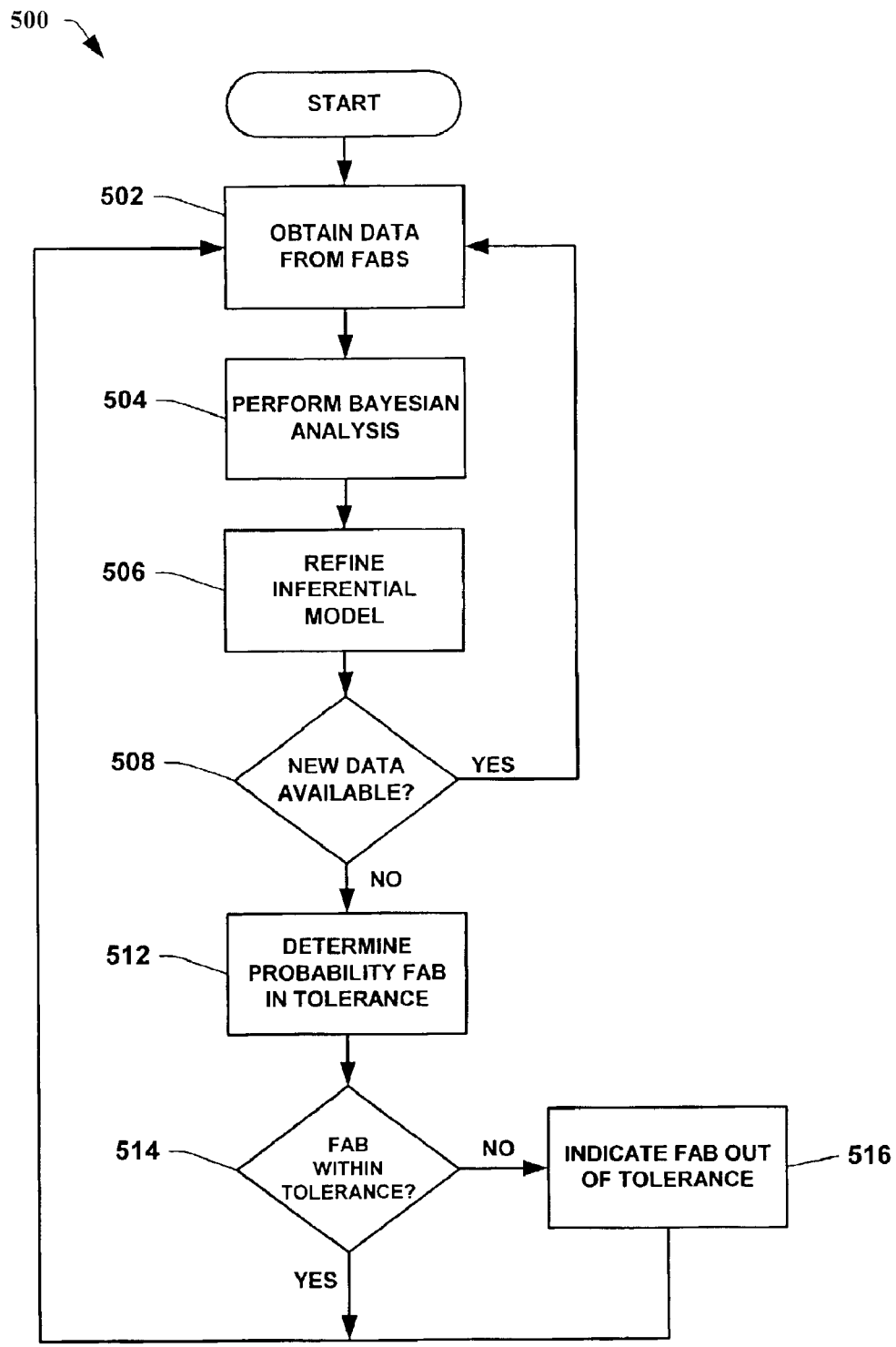
FIG. 5 is a flow chart illustrating a method for data correlating in accordance with an aspect of the present invention.
Figure 6:
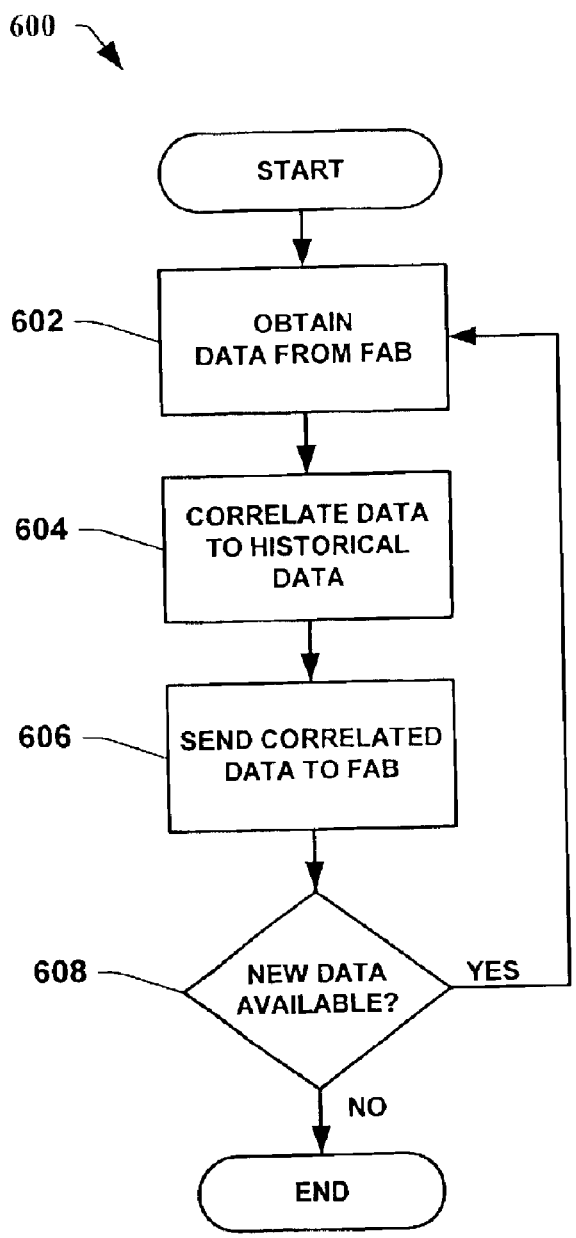
FIG. 6 is a flow chart illustrating a method for data correlating in accordance with an aspect of the present invention.

In view of the exemplary systems shown and described above, methodologies, which may be implemented in accordance with one or more aspects of the present invention, will be better appreciated with reference to the flow diagrams of FIGS. 4, 5 and 6. While, for purposes of simplicity of explanation, the methodologies are shown and described as a series of function blocks, it is to be understood and appreciated that the present invention is not limited by the order of the blocks, as some blocks may, in accordance with the present invention, occur in different orders and/or concurrently with other blocks from that shown and described herein.

Moreover, not all illustrated blocks may be required to implement a methodology in accordance with one or more aspects of the present invention. It is to be appreciated that the various blocks may be implemented via software, hardware a combination thereof or any other suitable means (e.g. device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Continuing with FIG. 4, a method 400 for data correlating in accordance with an aspect of the present invention is illustrated. The method 400 depicts one instance of the present invention. At 402, data is obtained from the fabs (e.g., via a communication means). At 404, the data are correlated to other fabs. At 406, the correlated data is then sent to the fabs (e.g., for employment in their calibration scheme). At 408, a determination is made as to whether new data from the fabs is available. If the determination at 408 is YES, processing continues at 402. If the determination at 408 is NO, no further processing occurs.

It is to be appreciated that the method 400 can repeat continuously or only during scheduled periods. This allows the data to be transferred (e.g., in real time) between fabs without losing valuable production time. Thus, there is no need to keep a manufacturing tool idle while waiting for a test wafer to arrive at the fab facility.

Referring next to FIG. 5, a method 500 for data correlating in accordance with an aspect of the present invention is illustrated. At 502, data is obtained from the fabs. At 504, a Bayesian type analysis is performed on the data. At 506, the results of the Bayesian type analysis are used to refine an inferential model (e.g., to aid in the prediction of when a fab can most likely be considered out of tolerance). At 508, a determination is made as to whether new data is available. If the determination at 508 is YES, processing continues at 502.

If the determination at 508 is NO, at 512, a probability of fab tolerance conformity can be determined. At 514, a determination is made as to whether the fab is within tolerance. If the determination at 514 is YES, processing continues at 502. If the determination at 514 is NO, at 516, an indication is given to that effect.

The Bayesian analysis provides a means for accounting for uncertainty in areas such as, statistical inference, forecasting, decision making under uncertainty, computer-based expert systems, etc. For instance, a complex fab calibration involving making a decision based on production forecasts, which are in turn based on the analysis of the fab data, becomes a single process in the Bayesian analysis. This allows uncertainties in one part of the analysis to be properly reflected in the other parts of the analysis. The analysis takes into account the prior data and the costs associated with various possible outcomes. The information gleaned from this analysis permits the manufacturer to increase yield and profits by being better informed of the impacts of each decision.

Data extracted from the Bayesian analysis is continually used to increase the accuracy of the inferential model for calibrating the fabs. As the accuracy increases for determining when a particular fab or tool will become out of tolerance, the operational costs for that fab process will decrease. This is the result of only recalibrating the fab devices when they have a high likelihood of being out of tolerance. Downtime due to retuning a tool in a fab process can be quite lengthy and costly. The present invention facilitates in avoiding these production inefficiencies.

Once it can be determined that the probability is high that a particular fab process will soon be out of tolerance, the individual fab can be notified. This can be accomplished via the communication means described above or by another similar means. In one aspect of the present invention, the out of tolerance fab can be remotely flagged for recalibration by the correlating system. Taking this one step further, the affected process can be shut down remotely by the correlating system to prevent flawed semiconductor devices from being produced. A system can also be installed that allows a notification signal to be displayed at each fab, indicating "in tolerance" or "out of tolerance". Such a system might employ a red flag/green flag type of indicator allowing easy discernment by an operator. It is also possible to display the actual inferencing data in a graphical format to show the probabilistic divergence of the tool to the ideal tolerance boundaries.

Turning next to FIG. 6, a method 600 of data correlation in accordance with an aspect of the present invention is illustrated. At 602, data is obtained from at least one fab. At 604, the data is correlated to historical data. The historical data can be prior data for that particular fab, or it can be prior data for other fabs involved in the manufacturing process. At 606, the correlated data is then sent to the fab. At 608, a determination is made as to whether new data is available. If the determination at 608 is YES, processing continues at 602. If the determination at 608 is NO, no further processing occurs.

Often, a particular fab tool has an inherent tendency to deviate from a set value in a somewhat predictable fashion. Over time, this behavior characteristic will make itself evident in its historical data. By comparing the starting test wafer data to previous parametric data, it can be possible to predict how long the fab tool will operate before needing to be recalibrated. Thus, this aspect of the present invention can be used as a predictive means to determine when to check for recalibration. It also permits the viewing of all historical data for the entire manufacturing process. Access to this information can indicate when certain sets of fabs tend to migrate towards compounding error levels. Adjustments can be made in the process to ensure that the tolerances are kept in check for a longer period of time. Altering the order of the fab tools or using only tools that do not normally have compounding errors can accomplish this.

Figure 7:
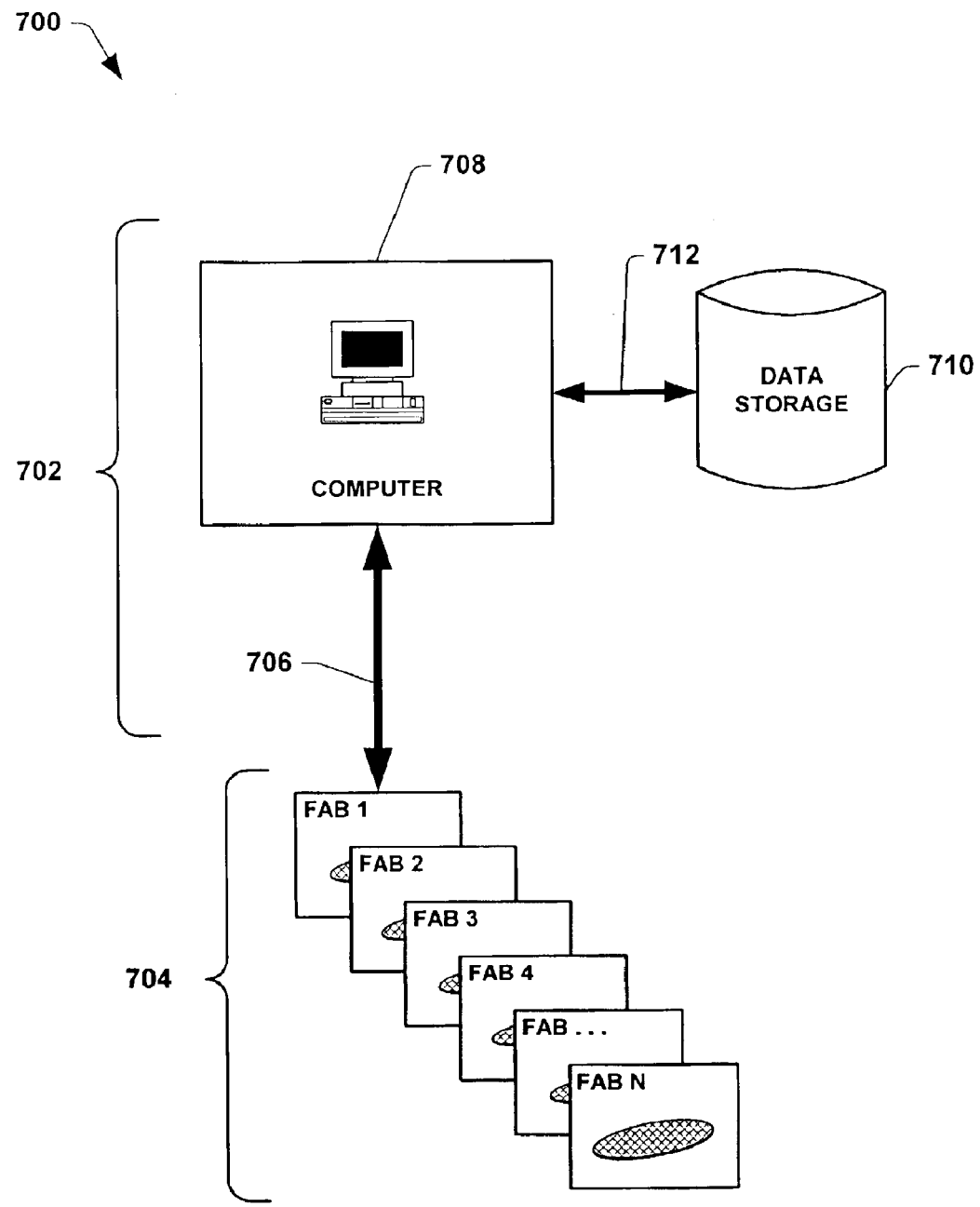
FIG. 7 is a diagram of a fab correlating system in accordance with an aspect of the present invention.

Next, referring to FIG. 7, a fab correlating system 700 in accordance with an aspect of the present invention is illustrated. The fab correlating system 700 comprises a computer system 702 and a plurality of fabs 704. The computer system 700 comprises a computer 708, data storage 710, data transfer means 712 for storing and retrieving data between the computer 708 and the data storage 710, and a communication means 706 for sending and receiving data between the fabs 704 and the computer 708.

The computer 708 can be any device capable of relating data. In one aspect of the present invention, all that is required is the ability to correlate one set of data to another. A high degree of computational capabilities is not required for this purpose. In another aspect of the present invention, algorithms are utilized to predict future events. This aspect of the invention requires a greater level of computational ability. It is conceivable that the invention can utilize any number of different types of computers, employing whatever type is available, necessary and cost efficient. The present invention is flexible enough to allow scaling of the required computing power.

Generally speaking, most computers today have a visual element that relays information to a user. This element usually contains a "graphical user interface" or GUI. The GUI relates information from the computer system in a user-friendly format that an operator can easily understand. A typical display monitor device is an example utilizing a GUI. However, it is not required that the present invention employ only this type of interface. The interaction of the computer 708 to the rest of the fab correlating system 700 can be automated and not require any type of user interface at all. It is also conceivable that the system 700 can employ a simple text interface without graphics. It can also negate any display device entirely and utilize an aural indicator element. In this type of system, tones can be employed to relate tolerance conformity to individual fab machinery. The system can also use the spoken word to convey information to an operator. This can aid the operator in allowing him to freely move about without the need to be tied to viewing a monitor type system.

To one skilled in the art, it is apparent that the computer itself can have data storage, negating the need for an external storage device. The data storage can be optical, flash, RAM, and magnetic media and the like. The device can constitute volatile or nonvolatile type storage. When long term tracking of data is required, nonvolatile storage is preferred. This allows the data to be stored during power interruptions. The type of storage chosen can be based on the speed at which the data is required to be employed. RAM and flash are generally faster at storage retrieval than optical or magnetic type media. It is possible with the present invention that the actual data is stored at the fabs and processed at another location. The data can be accessed by the computer 708 on an as needed basis. This reduces the storage requirement for the facility where the computer is located. This, in effect, combines the data transfer means 712 and the communication means 706 into a single entity.

Another aspect of the present invention can allow the elimination of data storage altogether. This aspect can process incoming data on a real time basis. The processing results are then immediately output to the respective fabs. In yet another aspect of the present invention, the data storage 710 can be a printer, plotter and any other type of device capable of transcribing data. This can include visual and aural transcriptions. In today's technological revolution, it is not uncommon to find new devices that can easily translate one form of communication into another. For example, scanning data from a printed sheet back into computer readable data can be done in very little time. Another example is digitizing aural recordings such that a computer can instantly read the information from the digitizing device. Thus, the present invention can utilize any means of data storage.

The communication means 706 can comprise landlines, cellular, satellite, microwave, optical, and radio communications and the like. Relaying information can be accomplished in many different forms. The present invention does not preclude employing any type of communication means currently implemented or any type not yet invented. As long as the data from the fabs can be relayed to the computer 708, the communication means can be deemed sufficient for the present invention. When the computer resides within a fab, the communication means can also be wire and Ethernet Wireless technologies can be employed as well.

As described previously, it can be appreciated that the fabs 704 can be any number, including just a single fab. In one instance of the present invention, a fab may have several tooling machines. These machines can produce data that is sent to the computer 708. Thus, the system 700 can correlate the data from within a single fab to great benefit. This reduces the time spent moving test wafers from machine to machine within the fab facility. It can also track historical data and inherent error information on a per machine basis.

Other instances of the present invention include, but are not limited to, the computer being a handheld device, a laptop, a programmable controller, and a computational device and the like. It can be desirable to have a computer 708 that is small and portable. This enables an operator to transport the unit to any location to monitor activity. It is also possible with the present invention to preclude requiring a physical device to be carried. This is accomplished by utilizing the Internet. The actual computer 708 can be located anywhere, centralized or distributed, and can be accessed at any terminal with an Internet connection. This eliminates export license and security concerns related to transporting computing devices. It also eliminates the need for concern about software, hardware, and connection compatibilities from facility to facility. The present invention does not require a specific means to accomplish its tasks. Any means capable of accepting, correlating and transferring data can be used to accomplish the present invention.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A fab correlating system, comprising
communication means for sending and receiving data between the fab correlating system and at least one of a plurality of fabs; and
a correlating system that receives calibration data from at least one of the plurality of fabs via the communication means, analyzes the calibration data to form correlated data, and transmits the correlated data to at least one of the plurality of fabs via the communication means; the correlated data utilized to calibrate the fab.

2. The fab correlating device of claim 1, the correlating system comprising a centralized system.

3. The fab correlating device of claim 1, the correlating system comprising a distributed system.

4. The fab correlating device of claim 1, the correlating system comprising at least one of the plurality of fabs.

5. The fab correlating device of claim 1, the correlating system operatively coupled to at least one of the plurality of fabs.

6. The fab correlating device of claim 1, the communication means comprising at least one of an Internet connection, a satellite connection, a landline connection, a cellular connection, a microwave connection, an optical connection and a radio connection.

7. The fab correlating device of claim 1, the communication means comprising data storage media transference.

8. The fab correlating device of claim 1, the correlating system comprising a computing means for correlating data and a data storage means for storing correlating data.

9. A system for correlating fab data comprising:
means for inputting fab calibration data of at least one of a plurality of fabs; and
means for correlating the fab calibration data to determine tolerance adherence.

10. The system of claim 9, further comprising a means for applying Bayesian principles to create tolerance inferences about at least one of the plurality of fabs.

11. The system of claim 9, further comprising a means of remotely controlling at least one of the plurality of fabs based on out-of-tolerance correlated data.

12. A fab correlating system comprising:
a computer for correlating calibration data from at least one of a plurality of fabs; and
a communication means for communicating between the computer and at least one of the plurality of fabs.

13. The fab correlating system of claim 12, the computer provides an analysis means to apply Bayesian inferencing.

14. The fab correlating system of claim 12, the computer comprises at least one of a laptop, a programmable controller, a handheld device and a desktop computer.

15. The fab correlating system of claim 12, further comprising a notification means for relaying correlation based information from the computer to at least one of the plurality of fabs.

16. The fab correlating system of claim 12, further comprising a data storage means for storing and retrieving data from the computer.

17. A semiconductor fabrication correlation system, comprising:
a correlation system that correlates calibration data changes to a test wafer with changes in extrinsic variables associated with a semiconductor fabrication process;
a non-linear training system that learns correlations generated by the correlation system; and
a controller that modifies the fabrication process based at least in part upon an output from the non-linear training system.

18. The system of claim 17 further comprising a data fusion processor.

19. The system of claim 17 employed concurrently in connection with correlating processes and/or equipment associated with a plurality of semiconductor fabrication facilities.

* * * * *

UNITED STATES PATENT AND TRADEMARK OFFICE
CERTIFICATE OF CORRECTION

PATENT NO. : 6,878,560 B1
DATED : April 12, 2005
INVENTOR(S) : Bharath Rangarajan et al.

It is certified that error appears in the above-identified patent and that said Letters Patent is hereby corrected as shown below:

Column 9,
Line 18, change "If FIG. 3" to -- In FIG. 3 --.

Signed and Sealed this

Thirty-first Day of January, 2006

JON W. DUDAS
*Director of the United States Patent and Trademark Office*